United States Patent
Akaishi

(10) Patent No.: US 11,095,143 B2
(45) Date of Patent: Aug. 17, 2021

(54) BATTERY CONTROL UNIT

(71) Applicant: TOYOTA JIDOSHA KABUSHIKI KAISHA, Toyota (JP)

(72) Inventor: Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 133 days.

(21) Appl. No.: 16/658,304

(22) Filed: Oct. 21, 2019

(65) Prior Publication Data
US 2020/0153263 A1    May 14, 2020

(30) Foreign Application Priority Data
Nov. 9, 2018    (JP) .............................. JP2018-211499

(51) Int. Cl.
*H02J 7/00*      (2006.01)
*G01R 31/3828*   (2019.01)
*H02J 7/14*      (2006.01)

(52) U.S. Cl.
CPC ........ *H02J 7/0086* (2013.01); *G01R 31/3828* (2019.01); *H02J 7/1446* (2013.01)

(58) Field of Classification Search
None
See application file for complete search history.

(56) References Cited

U.S. PATENT DOCUMENTS

| | | | |
|---|---|---|---|
| 2006/0202663 A1* | 9/2006 | Cho, II ............... | H01M 10/425 320/132 |
| 2008/0085430 A1* | 4/2008 | MacBain ............ | H01M 8/0488 429/9 |
| 2009/0208821 A1* | 8/2009 | Kosugi ................. | H02J 7/0016 429/61 |
| 2012/0065824 A1* | 3/2012 | Takahashi ............. | H02J 7/0021 701/22 |
| 2012/0133332 A1* | 5/2012 | Ogane ................. | H01M 10/486 320/134 |
| 2019/0030983 A1* | 1/2019 | Miller ..................... | B60L 53/14 |

FOREIGN PATENT DOCUMENTS

JP    2010-266221 A    11/2010
WO    2018/181489 A1   10/2018

* cited by examiner

*Primary Examiner* — Arun C Williams
(74) *Attorney, Agent, or Firm* — Oliff PLC

(57) ABSTRACT

A battery control unit includes an estimation device, a setting device, and a control device. When an open circuit voltage of the battery falls within a range of a flat region, the setting device sets the control storage amount to a first storage amount determined from the lower limit voltage of the flat region, the control device charges the battery until the open circuit voltage becomes a first voltage exceeding the upper limit voltage of the flat region after a vehicle comes into a drivable state, and the setting device sets a storage amount estimated by the estimation device to a control storage amount until the open circuit voltage reaches the first voltage, and sets a second storage amount determined from the open circuit voltage to the control storage amount after the open circuit voltage reaches the first voltage.

5 Claims, 7 Drawing Sheets

BATTERY CONTROL UNIT

INCORPORATION BY REFERENCE

The disclosure of Japanese Patent Application No. 2018-211499 filed on Nov. 9, 2018 including the specification, drawings and abstract is incorporated herein by reference in its entirety.

BACKGROUND

1. Technical Field

The disclosure relates to a battery control unit mounted on a vehicle.

2. Description of Related Art

It has been proposed to use an iron phosphate-based lithium ion battery (LFP battery) as a battery mounted on a vehicle. The LFP battery has a flat region in a SOC-OCV characteristic curve that can uniquely specify a storage amount (SOC) from an open circuit voltage (OCV) (see FIG. 2). Thus, it is difficult to estimate a battery storage state in the flat region with a high degree of accuracy.

As a solution to this problem, Japanese Unexamined Patent Application Publication No. 2010-266221 (JP 2010-266221 A) discloses a technique in which, when an open circuit voltage is in a flat region, the storage amount of a battery is estimated by calculating an actual charge/discharge integrated amount in a battery and adding the calculated integrated amount to a reference SOC at the lower voltage side than the flat region.

SUMMARY

However, in the technique disclosed in JP 2010-266221 A, for example, when the state of the battery stays in the flat region for a long period of time, there is a possibility that the measurement errors of a current sensor for obtaining an accumulated amount of a current due to charge-discharge are accumulated to increase a deviation between the estimated storage amount and the actual storage amount of the battery.

The disclosure provides a battery control unit capable of suppressing a deviation between an estimated storage amount and an actual storage amount of a battery and capable of managing a storage state of the battery with a high degree of accuracy.

One aspect of the disclosure provides a battery control unit for a vehicle for managing a state of charge of a battery which exhibits a SOC-OCV characteristic curve having a flat region in which a change rate of an open circuit voltage with respect to a storage amount of the battery is equal to or less than a predetermined value, the battery control unit including: an acquisition device configured to acquire the open circuit voltage of the battery; a determination device configured to perform a first determination to determine whether the open circuit voltage of the battery acquired by the acquisition device falls within a specific range from a lower limit voltage of the flat region to an upper limit voltage of the flat region; an estimation device configured to perform a first estimation to estimate the storage amount of the battery based on an integrated current amount; a setting device configured to set a control storage amount which is referred to as a value representing the storage amount of the battery; and a control device configured to control a charge and discharge of the battery based on the open circuit voltage of the battery or the control storage amount such that the storage amount of the battery becomes a predetermined target value. When the determination device determines that the open circuit voltage of the battery falls within the specific range when the vehicle is in an ignition-on state, the setting device sets the control storage amount to a first storage amount less than the storage amount that is determined from the lower limit voltage of the flat region based on the characteristic curve. The control device charges the battery based on the open circuit voltage until the open circuit voltage of the battery becomes a first voltage, that exceeds the upper limit voltage of the flat region, after the control storage amount is set to the first storage amount and the vehicle comes into a drivable state The setting device sets the storage amount estimated by the estimation device to the control storage amount until the open circuit voltage of the battery reaches the first voltage, and sets a second storage amount that is determined from the open circuit voltage of the battery based on the characteristic curve to the control storage amount after the open circuit voltage of the battery reaches the first voltage.

In the battery control unit of the disclosure, when the open circuit voltage of the battery is in the flat region, after the open circuit voltage of the battery is raised to outside the flat region by immediately performing a predetermined charge, the control storage amount referred to as a value representing the storage amount of the battery is reset as soon as possible. Therefore, it is possible to suppress the deviation between the control storage amount and the actual storage amount of the battery and to accurately manage the state of charge of the battery.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Embodiment

The battery control unit of the disclosure uses a control storage amount referred to as a value representing a storage amount of a battery. The control storage amount is set to a storage amount that can be uniquely specified from an open circuit voltage of the battery acquired at the time of IG-ON of a vehicle based on a SOC-OCV characteristic curve. When the open circuit voltage of the battery is in a flat region where the storage amount cannot be uniquely specified, the storage state of the battery is moved out of the flat region by charge/discharge control and then the control storage amount is set to a storage amount specified from the open circuit voltage. Therefore, it is possible to suppress a deviation between the control storage amount and the actual storage amount of the battery.

In the following embodiment, there will be described, by way of example, a case where the battery control unit of the disclosure is applied to a battery for automatic driving backup mounted on a vehicle equipped with an automatic driving system, which is one of the batteries that needs to manage the charge state thereof with a high degree of accuracy.

Configuration

Figure 1:
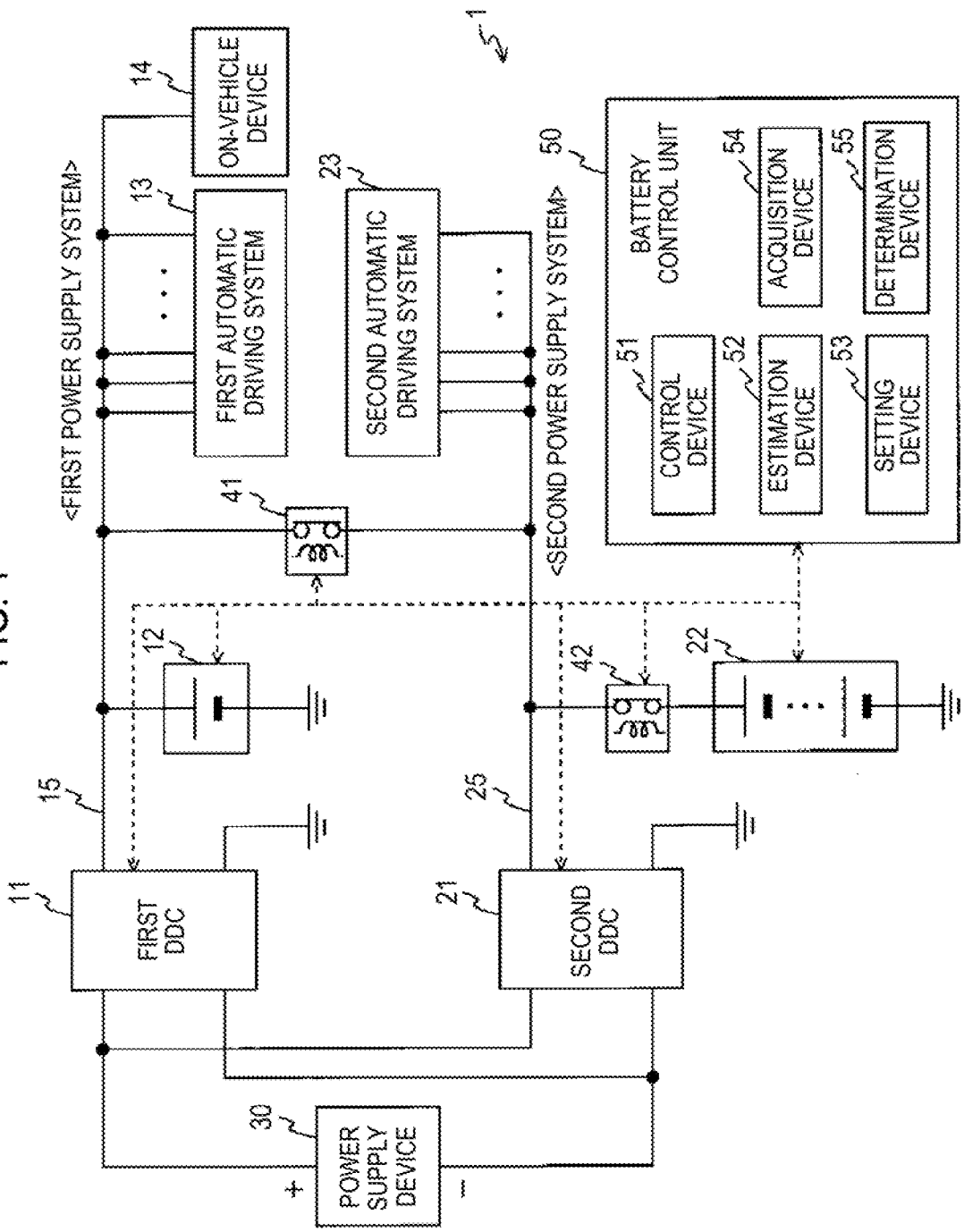
FIG. 1 is a view showing a schematic configuration example of a vehicular redundant power supply system including a battery control unit according to the present embodiment.

FIG. 1 is a view showing a schematic configuration example of a vehicular redundant power supply system 1 including a battery control unit 50 according to the present embodiment. The redundant power supply system 1 illustrated in FIG. 1 includes: a first power supply system including a first DC-DC converter (hereinafter referred to as "first DDC") 11, a first battery 12, a first automatic driving system 13 and on-vehicle devices 14; a second power supply system including a second DC-DC converter (hereinafter referred to as "second DDC") 21, a second battery 22 and a second automatic driving system 23; a power supply device 30; a first relay device 41; a second relay device 42; and a battery control unit 50. The first battery 12, the first automatic driving system 13 and the on-vehicle devices 14 of the first power supply system are coupled to the output side of the first DDC 11 by a first power supply line 15. The second battery 22 and the second automatic driving system 23 of the second power supply system are coupled to the output side of the second DDC 21 by a second power supply line 25.

The redundant power supply system 1 employs a redundant power supply configuration including the first power supply system and the second power supply system. The first power supply system and the second power supply system are coupled to each other via the first relay device 41 for dark current supply. The second battery 22 is coupled to the second power supply system via the second relay device 42 for battery protection. The connection/disconnection operations of the first relay device 41 and the second relay device 42 are controlled by the battery control unit 50.

The power supply device 30 is configured to supply power to the first DDC 11 and the second DDC 21 in parallel. As the power supply device 30, for example, a high voltage battery configured to be chargeable and dischargeable, such as a lithium ion battery or the like, is used.

The first DDC 11 is configured to convert the power supplied from the power supply device 30 and output the converted power to the first battery 12, the first automatic driving system 13 and the on-vehicle devices 14 through the first power supply line 15.

The first battery 12 is, for example, a secondary battery configured to be chargeable and dischargeable, such as a lead battery or the like. The first battery 12 is configured to store (charge) the power outputted from the first DDC 11, and is configured to output (discharge) power stored by itself to the first automatic driving system 13 and the on-vehicle devices 14. Furthermore, the first battery 12 is configured to store (charge) power released from the second battery 22, via the first relay device 41 and the second relay device 42.

The first automatic driving system 13 is a system including on-vehicle devices necessary for automatically driving a vehicle. Examples of the on-vehicle devices necessary for the automatic driving include an automatic driving ECU (Electronic Control Unit), an electric brake device (EBS), an electric power steering device (EPS) and the like.

The on-vehicle devices 14 include one or more on-vehicle devices not involved in the automatic driving of the vehicle. The on-vehicle devices 14 include, for example, devices such as headlamps and wipers.

The second DDC 21 is configured to convert the power supplied from the power supply device 30 and is configured to output the converted power to the second battery 22 and the second automatic driving system 23 through the second power supply line 25.

Figure 2:
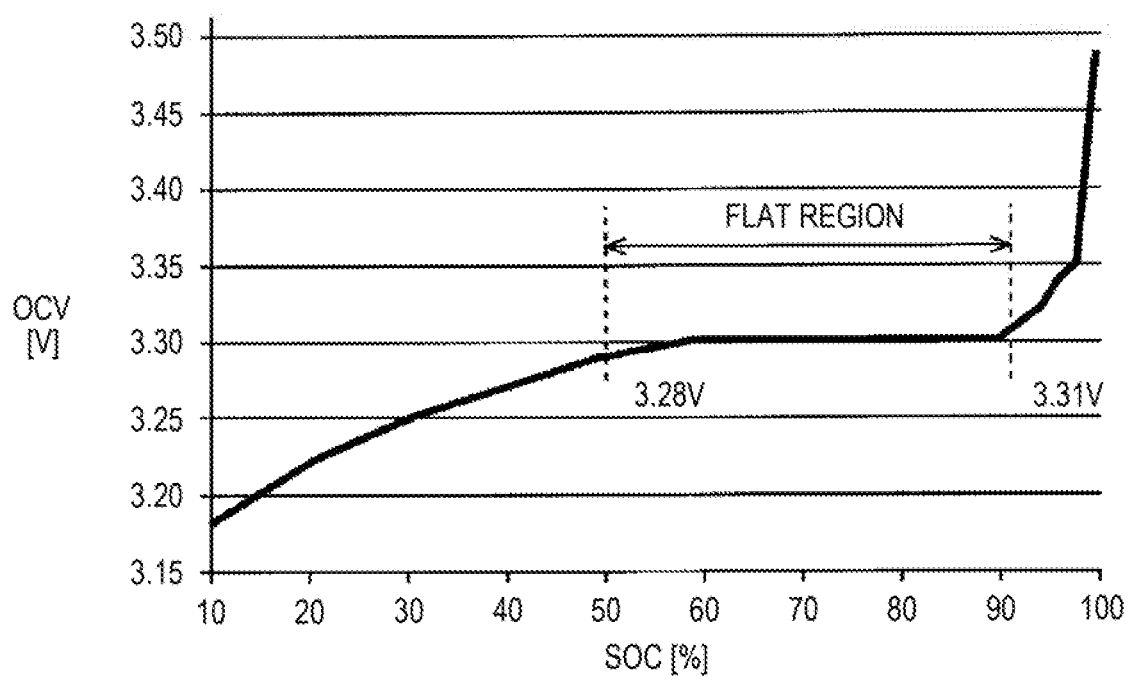
FIG. 2 is view showing an example of a SOC-OCV characteristic of a lithium ion battery.

The second battery 22 is, for example, a secondary battery configured to be chargeable and dischargeable such as a lithium ion battery or the like. For example, an iron phosphate-based lithium ion battery (LFP battery) can be used as the second battery 22. As shown in FIG. 2, the iron phosphate-based lithium ion battery exhibits an SOC-OCV characteristic curve having a flat region in which a change rate of an open circuit voltage (OCV) with respect to a storage amount (SOC) is smaller than that in an adjacent region. The second battery 22 is configured to store (charge) the power outputted from the second DDC 21 through the second relay device 42 and is configured to output (discharge) power stored by itself to the second automatic driving system 23 or the like. The second battery 22 is a backup battery that, in addition to supplying the power to the second automatic driving system 23, plays a role of a spare battery for backing up functions related to the automatic driving of a vehicle when the failure of the first battery 12 occurs during the automatic driving of the vehicle.

The second automatic driving system 23 is a redundantly provided system which is the same as the first automatic driving system 13. As with the first automatic driving system 13, the second automatic driving system 23 includes on-vehicle devices necessary for automatically driving a vehicle.

The first relay device 41 is provided between the first power supply line 15 and the second power supply line 25, and is configured to perform the connection and disconnection between the first power supply line 15 and the second power supply line 25 under the control of the battery control unit 50. At the time of turning off the vehicle power as in the case of parking or the like, the first relay device 41 connects the first power supply line 15 to the second power supply line 25 and forms a path for supplying a dark current from the first battery 12 to the second automatic driving system 23. The first relay device 41 stays in a disconnection state at other times than the above connection state and electrically isolates the first power supply system and the second power supply system.

The second relay device 42 is provided between the second power supply line 25 and the second battery 22, and is configured to perform the connection and disconnection between the second power supply line 25 and the second battery 22 under the control of the battery control unit 50. At the time of turning off the vehicle power as in the case of parking or the like, the second relay device 42 comes into a disconnection state and prevents a current from flowing from the second battery 22 to the second automatic driving system 23. The second relay device 42 stays in a connection state at other times than the above disconnection state and supplies power to the second automatic driving system 23.

The battery control unit 50 is configured to manage the states, operations or the like of the first DDC 11, the second DDC 21, the first battery 12, the second battery 22, the first relay device 41 and the second relay device 42 to control the state of the redundant power supply system 1. The battery control unit 50 of the present embodiment executes control for accurately estimating the charge state of the second battery 22.

The battery control unit 50 may be typically configured as an ECU (Electronic Control Unit) including a CPU (Central Processing Unit), a memory, an input/output interface and the like. The battery control unit 50 may include a part or all of ECUs mounted on a vehicle, such as a monitoring ECU for monitoring the voltage, current and temperature of the second battery 22, a power supply ECU capable of controlling the output voltage of the second DDC 21 or controlling the connection/disconnection state of the first relay device 41, and the like. In the battery control unit 50 of the present embodiment, functions of a control device 51, an estimation device 52, a setting device 53, an acquisition device 54 and a determination device 55 are realized by the CPU reading and executing the program stored in the memory.

The control device 51 appropriately controls a voltage indication value of the second DDC 21 to implement a so-called normal charge in which the charge and discharge of the second battery 22 is performed based on the open circuit voltage of the second battery 22 so that the storage amount of the second battery 22 becomes a predetermined target value (e.g., 90% of the maximum storage capacity). In addition, when a predetermined condition to be described later is satisfied, the control device 51 appropriately controls the voltage indication value of the second DDC 21 to implement a so-called CCCV charge in which the second battery 22 is charged at a constant current (CC charging) until reaching a predetermined storage amount (e.g., 98% of the maximum storage capacity) and the second battery 22 is charged at a constant voltage (CV charge) after reaching the predetermined storage amount. The CCCV charge is implemented during a READY-ON period in which a vehicle is kept in a drivable state, based on a control storage amount (hereinafter referred to as "control SOC") which is referred to as a value representing the storage amount of the second battery 22.

The estimation device 52 integrates a charge current and a discharge current generated according to the charge and discharge control performed by the control device 51 and estimates the storage amount of the second battery 22 based on the integrated current amount (in a first estimation). The charge current and the discharge current may be obtained by a current sensor provided in the second battery 22.

In addition, the estimation device 52 estimates the maximum value of the storage amount (hereinafter referred to as "SOC_MAX") and the minimum value of the storage amount (hereinafter referred to as "SOC_MIX") of the second battery 22, which include an integrated value of estimation errors of the charge amount of the battery and an integrated value of estimation errors of the discharge amount (in a second estimation). The SOC_MAX is the maximum storage amount including an estimation error in which a current value measured by the current sensor is larger than a current value actually flowing through the second battery 22. The SOC_MIN is the minimum charge amount including an estimation error in which the current value measured by the current sensor is smaller than the current value actually flowing through the second battery 22. The error generated in the current sensor may be estimated by acquiring the error in advance by actual measurement, or may be estimated based on a product standard of the current sensor.

The setting device 53 sets a control SOC which is referred to as a value representing the storage amount of the second battery 22. The storage amount of the second battery 22 estimated by the estimation device 52 is set to the control SOC. The setting device 53 also reviews the setting at any time so that a deviation between the actual storage amount (hereinafter referred to as "actual SOC") of the second battery 22 and the control SOC does not become large. Details of the control SOC setting method will be described later.

The acquisition device 54 acquires an open circuit voltage (OCV) of the second battery 22. The open circuit voltage of the second battery 22 can be acquired by a voltage sensor or the like provided in the second battery 22.

The determination device 55 determines whether the open circuit voltage of the second battery 22 acquired by the acquisition device 54 when the ignition of a vehicle is turned on (IG-ON) falls within a specific range which is equal to or higher than a lower limit voltage of the flat region in the SOC-OCV characteristic curve and equal to or lower than an upper limit voltage of the flat region of the SOC-OCV characteristic curve (in a first determination). The lower limit voltage and the upper limit voltage of the flat region may be set based on whether the storage amount can be uniquely specified from the open circuit voltage in the SOC-OCV characteristic curve of the second battery 22. For example, in the case of the SOC-OCV characteristic curve shown in FIG. 2, the lower limit voltage may be 3.28 V and the upper limit voltage may be 3.31 V.

Furthermore, the determination device 55 determines whether a difference (=SOC_MAX−SOC_MIN) between the SOC_MAX and the SOC_MIN estimated by the estimation device 52 exceeds a predetermined threshold value (in a second determination). It is considered that, each time when the SOC_MIN and the SOC_MAX are integrated using a well-known current integration method, errors are accumulated and the deviation between the actual SOC of the second battery 22 and the SOC_MIN and the SOC_MAX becomes large. Therefore, the determination device 55 appropriately sets the predetermined threshold value based on a limit value that permits the deviation between the actual SOC of the second battery 22 and the SOC_MIN and the SOC_MAX. If the difference between the SOC_MIN and the SOC_MAX exceeds the predetermined threshold value, the determination device 55 causes the setting device 53 to correct the deviation between the actual SOC of the second battery 22 and the control SOC. Alternatively, the determination device 55 may determine whether a predetermined period of time has elapsed since the setting device 53 performs a SOC skip control (to be described later) to set the control SOC to a new storage amount (in a third determination). If it is determined that the predetermined period of time has elapsed, the determination device 55 may cause the setting device 53 to correct the deviation between the actual SOC of the second battery 22 and the control SOC.

Furthermore, the determination device 55 determines whether the SOC_MIN estimated by the estimation device 52 has reached the predetermined storage amount (in a fourth determination). If it is determined that the SOC_MIN has reached the predetermined storage amount, the determination device 55 permits the automatic driving of the vehicle. The predetermined storage amount is set to a minimum storage amount necessary for the second battery 22 to back up the function related to the automatic driving of the vehicle.

The detailed control of the control device 51, the estimation device 52, the setting device 53, the acquisition device 54 and the determination device 55 will be described below.

Control

Figure 3:
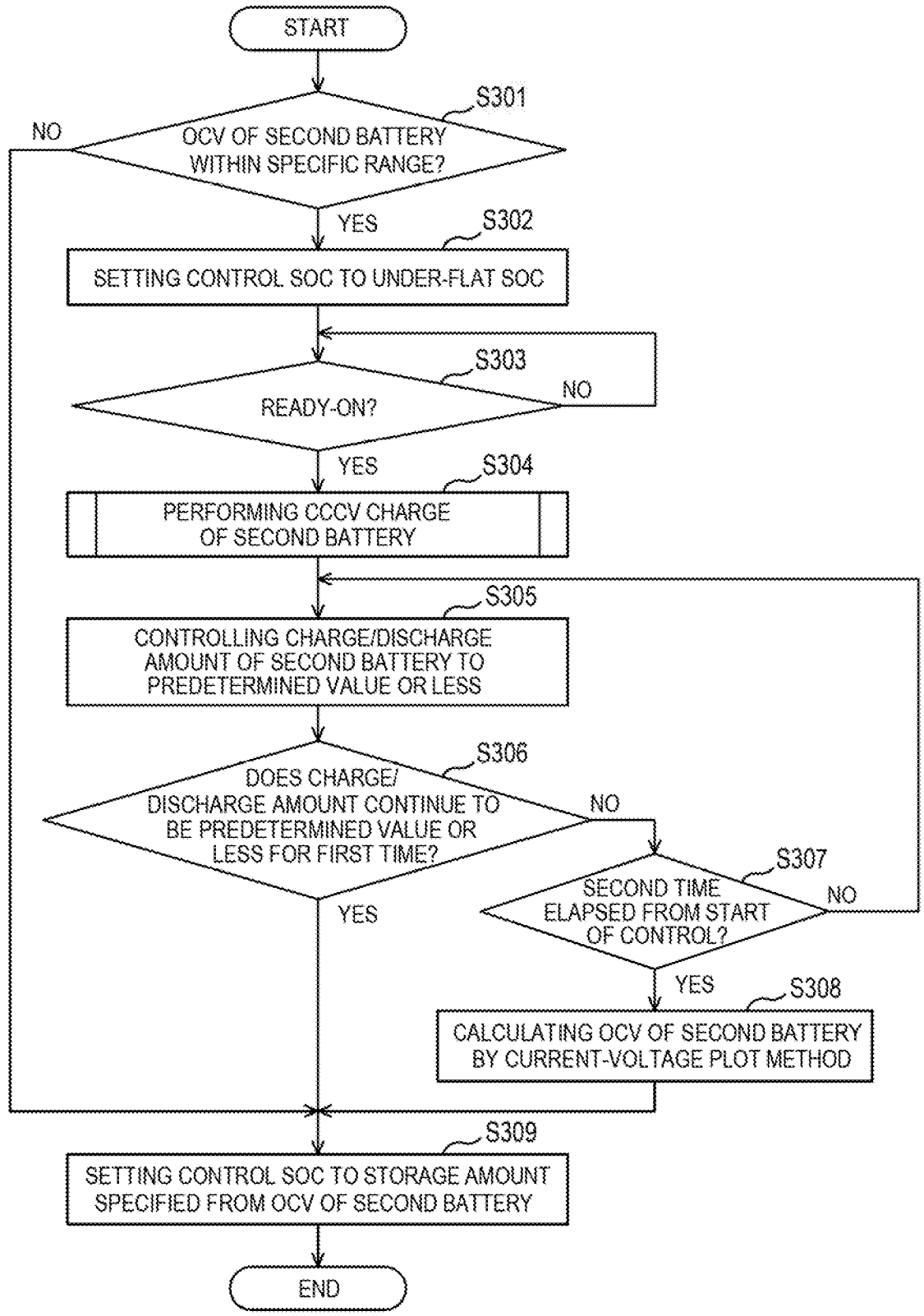
FIG. 3 is a flowchart for explaining a process of an initial SOC skip control.
Figure 4:
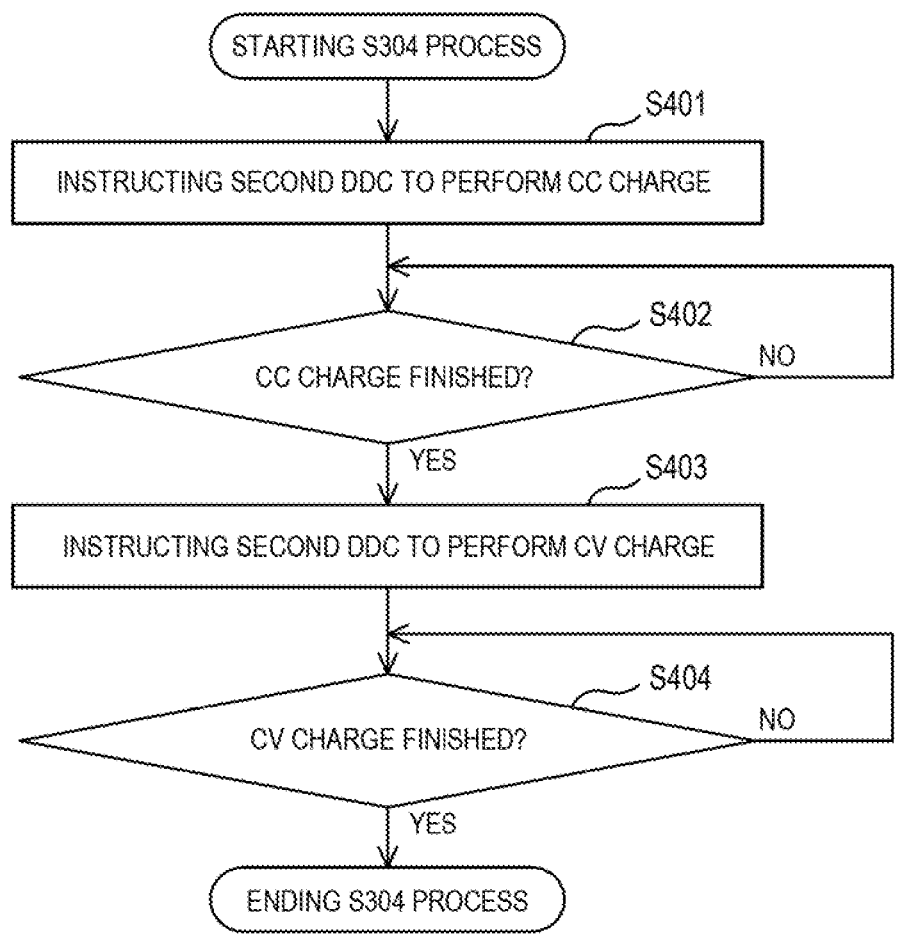
FIG. 4 is a flowchart for explaining a detailed process in step S304 of FIG. 3.
Figure 5:
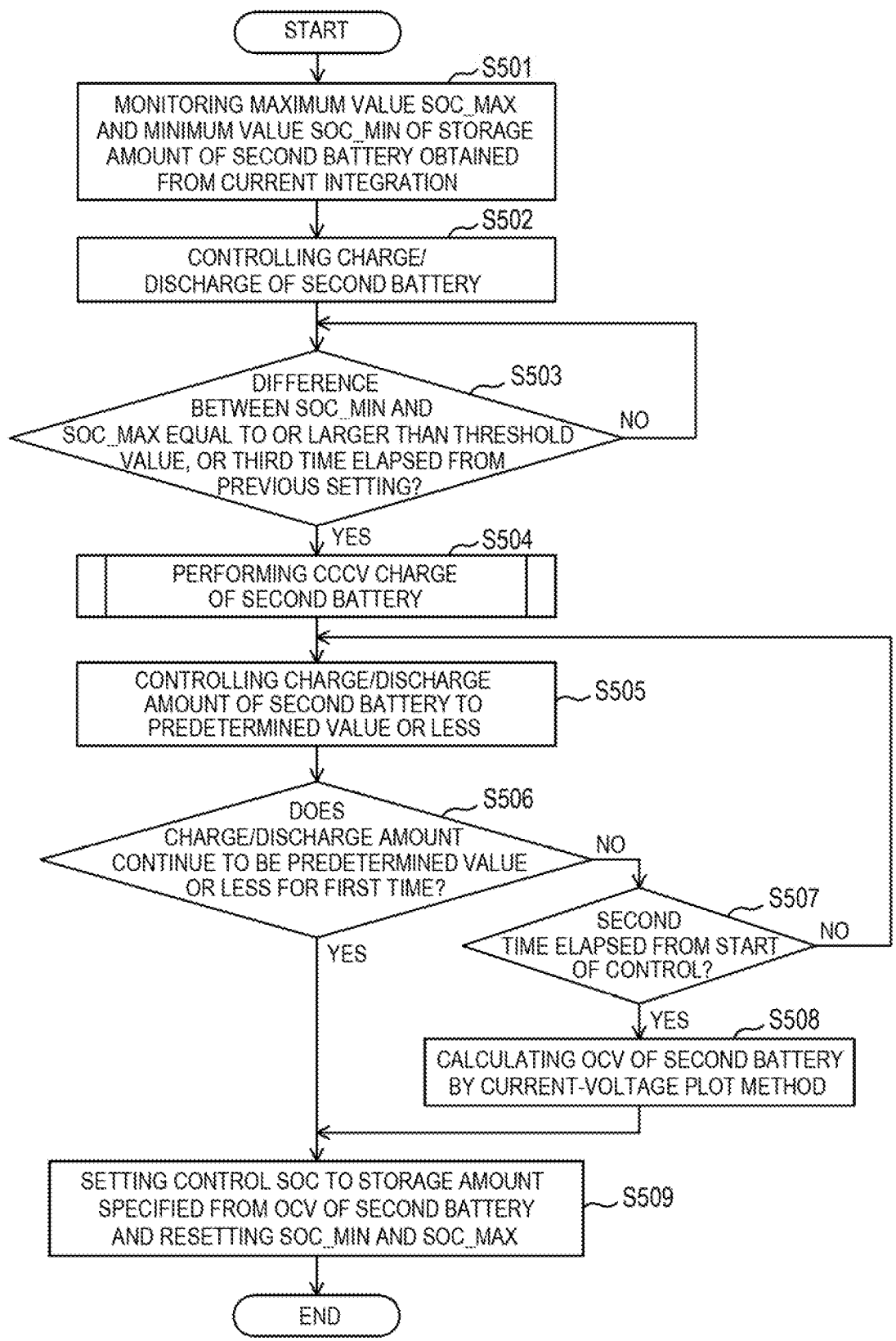
FIG. 5 is a flowchart for explaining a process in which automatic driving is permitted.
Figure 6:
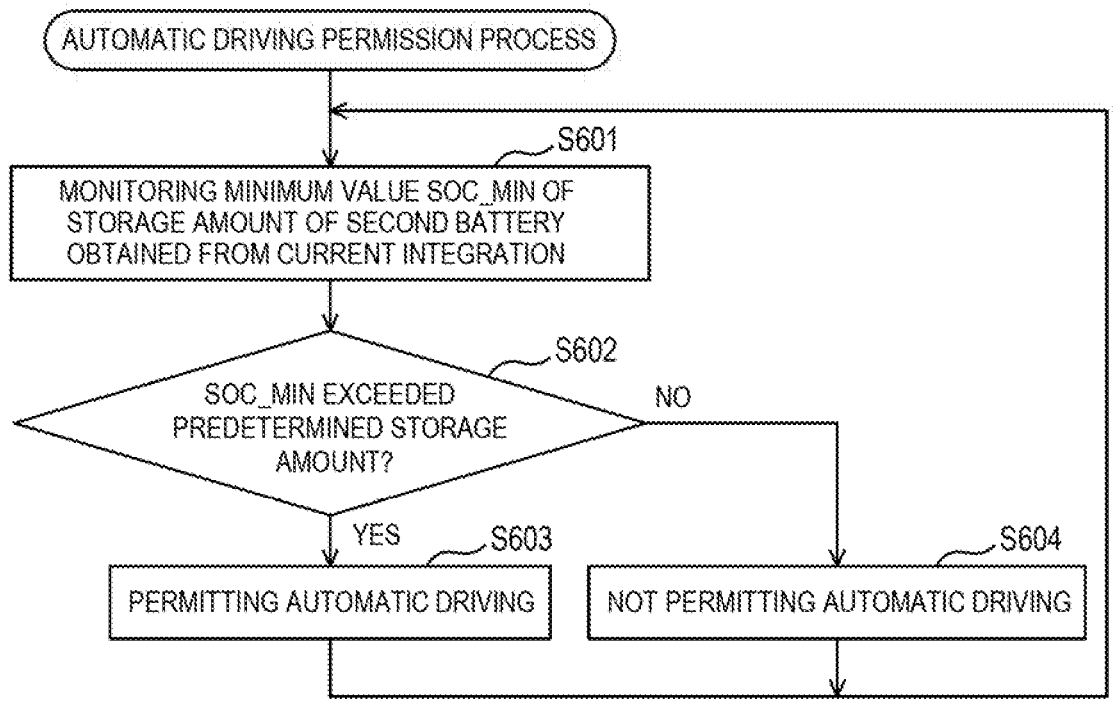
FIG. 6 is a flowchart for explaining a process of a normal SOC skip control.
Figure 7:
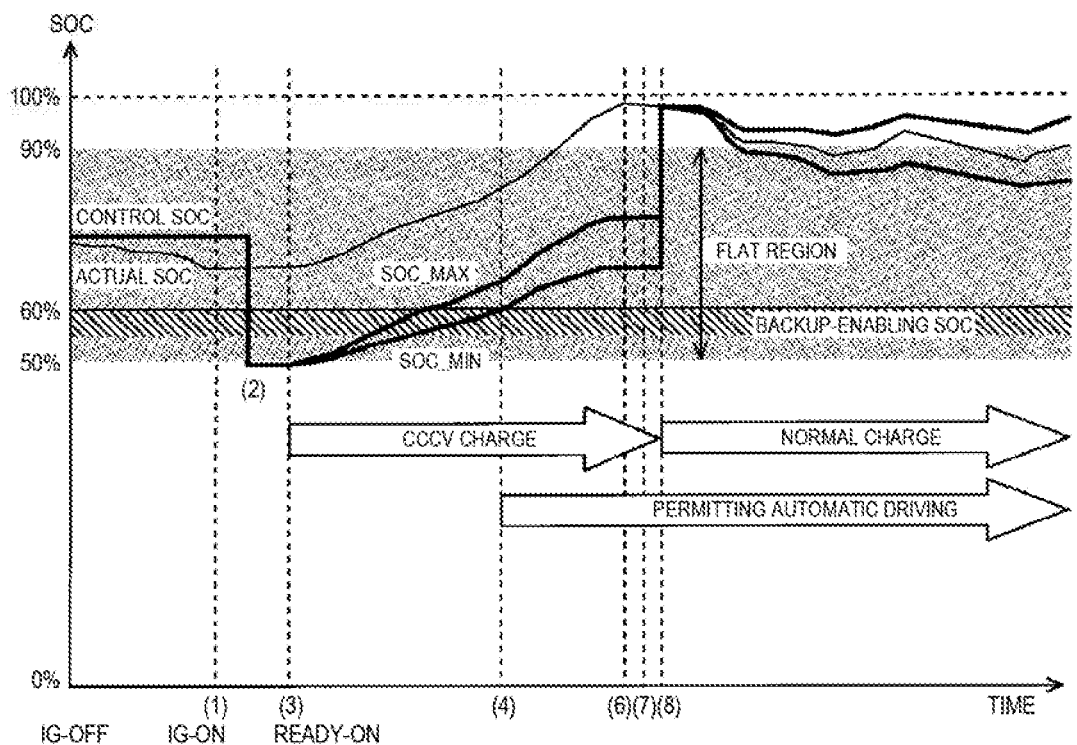
FIG. 7 is a timing chart for explaining the initial SOC skip control when the actual SOC of a second battery is in the flat region.
Figure 8:
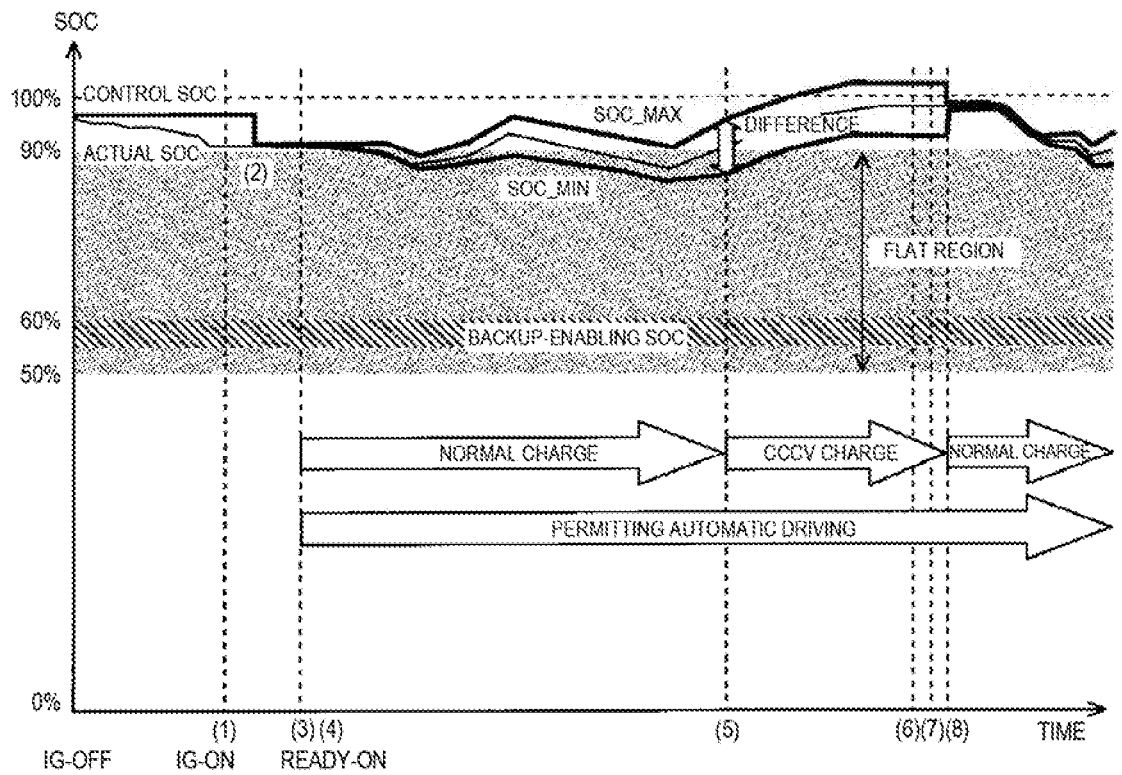
FIG. 8 is a timing chart for explaining the initial SOC skip control and the normal SOC skip control when the actual SOC of the second battery exists at the upper side of the flat region.
Figure 9:
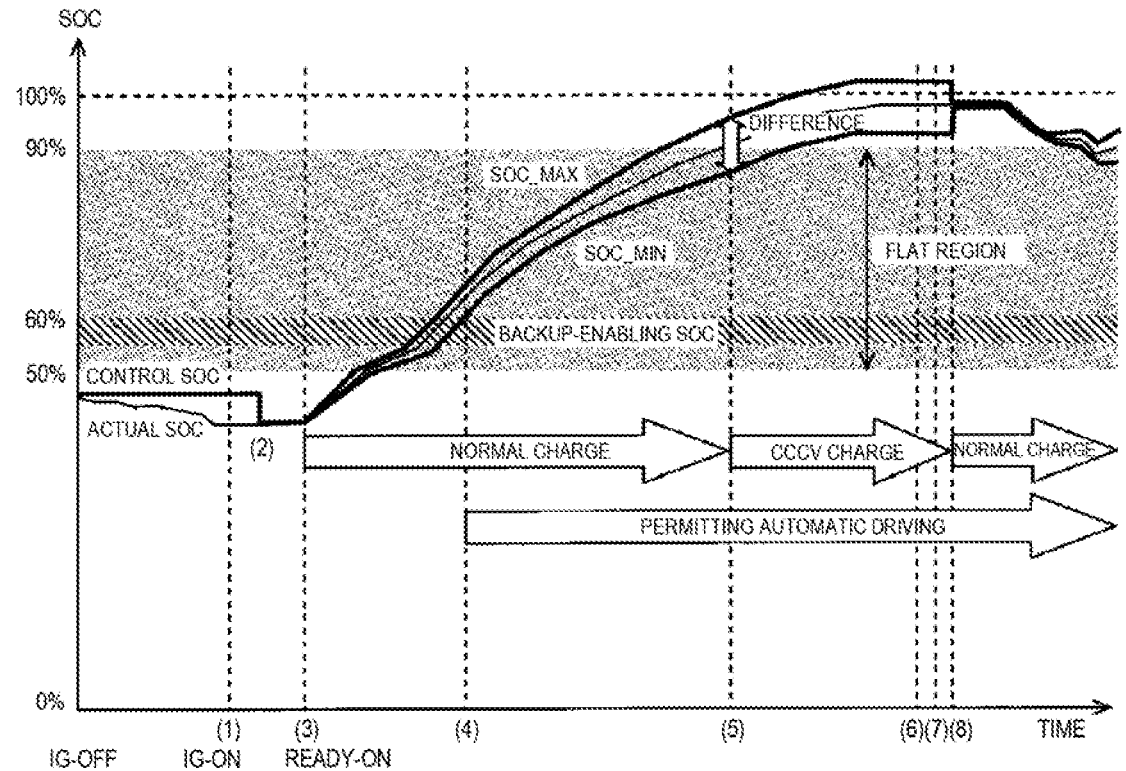
FIG. 9 is a timing chart for explaining the initial SOC skip control and the normal SOC skip control when the actual SOC of the second battery exists at the lower side of the flat region.

Next, a control executed by the battery control unit 50 according to the present embodiment will be described with further reference to FIGS. 3 to 9. FIG. 3 is a flowchart for explaining a process of initial SOC skip control. FIG. 4 is a flowchart for explaining a detailed process in step S304 of FIG. 3. FIG. 5 is a flowchart for explaining a process in which automatic driving is permitted in a vehicle provided with an automatic driving system. FIG. 6 is a flowchart for explaining a process of normal SOC skip control. FIGS. 7 to 9 are timing charts for explaining examples of the initial SOC skip control and the normal SOC skip control.

Initial SOC Skip Control

The initial SOC skipping control will be described with reference to FIGS. 3, 4, 7, 8 and 9. The initial SOC skip control is a control for correcting a deviation between the actual SOC of the second battery 22 and the control SOC, which is initially implemented after the vehicle comes into the IG-ON state.

While the vehicle is not used from the previous IG-OFF to the current IG-ON, it is considered that the storage amount of the second battery 22 is reduced due to self-discharge, battery cell equalization process or the like. The reduction in the storage amount causes a deviation between the actual SOC of the second battery 22 and the control SOC. Therefore, in the present embodiment, the initial SOC skip control is performed immediately after the vehicle comes into an IG-ON state. The process shown in FIG. 3 is started when the vehicle comes into the IG-ON state. This is performed at timing (1) in FIGS. 7, 8 and 9.

Step S301: The determination device 55 determines whether the actual SOC of the second battery 22 falls within a flat region of a SOC-OCV characteristic curve. Specifically, the determination device 55 determines whether the open circuit voltage (OCV) of the second battery 22 acquired by the acquisition device 54 falls within a specific range equal to or higher than the lower limit voltage of the flat region and equal to or lower than the upper limit voltage of the flat region. If it is determined that the open circuit voltage of the second battery 22 falls within the specific range equal to or higher than the lower limit voltage of the flat region and equal to or lower than the upper limit voltage of the flat region (YES in S301), the process proceeds to step S302 because the actual SOC of the second battery 22 is in the flat region and the storage amount cannot be uniquely specified from the open circuit voltage. FIG. 7 corresponds to this case. On the other hand, if it is determined that the open circuit voltage of the second battery 22 does not fall within the specific range equal to or higher than the lower limit voltage of the flat region and equal to or lower than the upper limit voltage of the flat region (NO in S301), the process proceeds to step S309 because the actual SOC of the second battery 22 falls outside the flat region and the storage amount can be uniquely specified from the open circuit voltage. FIGS. 8 and 9 correspond to this case.

In the examples of FIGS. 7, 8 and 9, the range of 50% to 90% of the storage amount is set as the flat region. The determination device 55 determines whether the actual SOC of the second battery 22 is in the flat region, by determining whether the open circuit voltage of the second battery 22 falls within a range (see FIG. 2) in which the open circuit voltage (lower limit voltage) is 3.28 V or more when the storage amount is 50% and the open circuit voltage (upper limit voltage) is 3.31 V or less when the storage amount is 90%. FIG. 7 shows a case where the actual SOC of the second battery 22 at the time of IG-ON is in the flat region. FIG. 8 shows a case where the actual SOC of the second battery 22 at the time of IG-ON exists at the upper side of the flat region (on the high SOC side). FIG. 9 shows a case where the actual SOC of the second battery 22 at the time of IG-ON exists at the lower side of the flat region (on the low SOC side).

Step S302: The setting device 53 sets the control SOC to a first storage amount (hereinafter referred to as "under-flat SOC") which is less than the storage amount determined from the lower limit voltage of the flat region in the SOC-OCV characteristic curve. That is to say, the control SOC is instantaneously dropped to the under-flat SOC (SOC skip). Such a drop is performed at timing (2) in FIG. 7. This setting is performed after a check executed by a predetermined system (such as a battery monitoring system or the like) during transition from the IG-ON state to the READY-ON state has been completed.

For example, when the storage amount determined from the lower limit voltage of the flat region is 50% as shown in FIGS. 7, 8 and 9, the storage amount (under-flat SOC) of less than 50% may be set as the control SOC. By this setting process, it is possible to set the control SOC to necessarily become lower than the actual SOC regardless of whether the actual SOC of the second battery 22 is in any state in the flat region. Therefore, if the second battery 22 is charged based on the control SOC after the setting, the actual SOC of the second battery 22 can be reliably increased to the upper side of the flat region (the high SOC side). If the setting is completed, the process proceeds to step S303.

Step S303: The control device 51 determines whether the vehicle is in a drivable READY-ON state. Since the second DDC 21 operates in the READY-ON state, it is possible to charge the second battery 22. If the READY-ON state is established (YES in S303), the process proceeds to step S304.

Step S304: The control device 51 performs CCCV charge with respect to the second battery 22. The CCCV charge is performed during a period of (3) to (7) in FIG. 7. A well-known method may be used for the CCCV charge. The CCCV charge performed in step S304 will now be described with further reference to FIG. 4.

Step S401: The control device 51 gives a voltage indication value to the second DDC 21 so that the second battery 22 is charged (CC-charged) at a predetermined constant current to a predetermined voltage (hereinafter referred to as "first voltage"). The first voltage is set to a voltage at which the actual SOC of the second battery 22 exceeds the upper limit voltage of the flat region. For example, in FIGS. 7, 8 and 9 in which the storage amount on the upper side of the flat region is 90%, the open circuit voltage when the storage amount is 98% may be set to the first voltage. Thus, the second battery 22 is CC-charged, and the storage amount of the second battery 22 estimated by the estimation device 52 is increased along with the CC charge. Until the CC charge is completed, the storage amount estimated by the estimation device 52 is set to the control SOC by the setting device 53.

Step S402: The control device 51 determines whether the CC charge has been completed. Specifically, the control device 51 determines whether the open circuit voltage of the second battery 22 has reached the first voltage. If it is determined that the CC charge has been completed (YES in S402), the process proceeds to step S403. This is timing (6) in FIG. 7.

Step S403: The control device 51 gives a voltage indication value to the second DDC 21 so that the second battery 22 can be charged (CV-charged) by supplying a current while maintaining a predetermined constant voltage, e.g., the first voltage in the present embodiment. Thus, the second battery 22 is CV-charged, and the control SOC is also changed along with the CV charge.

Step S404: The control device 51 determines whether the CV charge has been completed. Specifically, while maintaining the open circuit voltage of the second battery 22 at the first voltage, the control device 51 determines whether the current flowing into the second battery 22 has decreased to a predetermined value or less, or whether the CV charge has been performed during a predetermined period of time or more. If it is determined that the CV charge has been completed (YES in S404), the CCCV charge of step S304 ends. This is timing (7) in FIG. 7. The initial SOC skip control will be described again with reference to FIG. 3.

Step S305: The control device 51 performs control to make the charge/discharge amount of the second battery 22 equal to or less than a predetermined value after the CCCV charge ends. This is a period of (7) to (8) in FIG. 7. This control is performed to stabilize the state of the second battery 22 so that an appropriate open circuit voltage can be measured. Specifically, a voltage indication value is given to the second DDC 21 so that the charge/discharge amount of the second battery 22 does not change significantly beyond the predetermined value. If the control is started, the process proceeds to step S306.

Step S306: The control device 51 determines whether a state in which the charge/discharge amount of the second battery 22 is equal to or less than the predetermined value has continued during a first period of time. The first period of time is a period of time for determining that the second battery 22 is in a stable state, and may be set based on the characteristics of the second battery 22, the use environment temperature and the like. The first period of time can be measured using a counter or the like. If it is determined that the state where the charge/discharge amount of the second battery 22 is equal to or less than the predetermined value continues during the first period of time (YES in S306), the control device 51 determines that the second battery 22 is in the stable state. The process proceeds to step S309. If it is determined that the state in which the charge/discharge amount of the second battery 22 is equal to or less than the predetermined value does not continue during the first period of time (NO in S306), the control device 51 determines that the second battery 22 is not in the stable state. The process proceeds to step S307.

Step S307: The determination device 55 determines whether a second period of time has elapsed since the control device 51 has started the control to make the charge/discharge amount of the second battery 22 equal to or less than the predetermined value. The second period of time is a period of time for determining whether the control to make the charge/discharge amount equal to or less than the predetermined value should be continued for the second battery 22 which does not easily come into the stable state. The second period of time may be set based on the estimation accuracy and the system load required for the second battery 22. The second period of time can be measured using a counter or the like. If it is determined that the second period of time has elapsed since the start of the control to make the charge/discharge amount equal to or less than the predetermined value (YES in S307), the control is abandoned and the process proceeds to step S308. If it is determined that the second period of time has not elapsed since the start of the control to make the charge/discharge amount equal to or less than the predetermined value (NO in S307), the process proceeds to Step S305 to continue the control.

Step S308: Since the second battery 22 is not in the stable state, the control device 51 calculates the open circuit voltage of the second battery 22 using a known current-voltage plot method, instead of specifying the storage amount from the open circuit voltage of the second battery 22. Specifically, a predetermined charge/discharge pulse is applied to the second battery 22 by the second DDC 21 to measure plural sets of voltage and current. The intercept of an approximate straight line determined by plotting the plural sets of voltage and current thus measured is acquired as the open circuit voltage. If the open circuit voltage is calculated, the process proceeds to step S309.

Step S309: The setting device 53 sets, as the control SOC, a second storage amount specified from the open circuit voltage of the second battery 22 obtained by performing the processing of steps S302 to S308 (in the case of YES in S301), or a third storage amount specified from the open circuit voltage of the second battery 22 obtained without performing the processing of steps S302 to S308 (in the case of NO in S301). That is to say, the control SOC is instantaneously raised to the second or third storage amount specified from the open circuit voltage (SOC skip). This is timing (8) in FIG. 7. By this setting process, the deviation between the actual SOC of the second battery 22 and the control SOC is corrected, and the initial SOC skip control ends.

Normal SOC Skip Control

The normal SOC skip control will be described with respect to FIGS. 5, 8 and 9. The normal SOC skip control is a control for correcting the deviation between the actual SOC of the second battery 22 and the control SOC, which is implemented during the period in which the vehicle is in the drivable READY-ON state after the end of the above-described initial SOC skip control.

During the period in which the vehicle is in the READY-ON state, in principle, normal charge control is executed according to the state of the second battery 22, and the control SOC is changed following the actual SOC of the second battery 22. However, it is considered that, due to the measurement error generated by the current sensor, even in the READY-ON state, the error in the storage amount of the second battery 22 estimated by the estimation device 52 is accumulated to increase the deviation between the actual SOC of the second battery 22 and the control SOC. Therefore, in the present embodiment, even when the vehicle is in the READY-ON state, the normal SOC skip control is executed if a predetermined condition described later is satisfied.

Step S501: The determination device 55 monitors the SOC_MAX and the SOC_MIN of the storage amount of the second battery 22 estimated by the estimation device 52.

Upon starting the monitoring of the SOC_MAX and the SOC_MIN, the process proceeds to step S502.

Step S502: The control device 51 starts charge/discharge control of the second battery 22 by normal charge. The normal charge executes feedback control of the voltage value instructed to the second battery 22 so that the storage amount of the second battery 22 becomes a predetermined target value (e.g., the storage amount of 90%). The control SOC set by the setting device 53 and the SOC_MAX and SOC_MIN estimated by the estimation device 52 are also changed according to the charge/discharge control of the second battery 22. This is a period of (3) to (5) in FIGS. 8 and 9. Upon starting the charge/discharge control, the process proceeds to step S503.

Step S503: The determination device 55 determines whether a difference between the SOC_MIN and the SOC_MAX exceeds a predetermined threshold value (first condition). The threshold value may be set based on a limit value that permits a deviation between the actual SOC of the second battery 22 and the SOC_MIN and the SOC_MAX. Furthermore, the determination device 55 determines whether a third period of time has elapsed since the setting device 53 has performed the SOC skip control to set the control SOC to a new storage amount (second condition). The new storage amount is the second storage amount or the third storage amount described above. In a case where the normal SOC skip control is repeatedly performed, the determination device 55 may determine whether the third period of time has elapsed since the control SOC has been set to a below-described fourth storage amount by the previous normal SOC skip control. The third period of time is a period of time for determining a period in which the deviation between the actual SOC of the second battery 22 and the control SOC is not corrected. The third period of time may be set based on the estimation accuracy or the like required for the second battery 22. If it is determined that the difference between the SOC_MIN and the SOC_MAX exceeds the predetermined threshold value (the first condition is satisfied) or if it is determined that the third period of time has elapsed since the control SOC has been set to the new storage amount (the second condition is satisfied) (YES in S503), the process proceeds to step S504. This is timing (5) in FIGS. 8 and 9. On the other hand, in other cases (if neither the first condition nor the second condition is satisfied), the determination process of step S503 is continuously performed.

Step S504: The control device 51 performs CCCV charge with respect to the second battery 22. This is a period of (5) to (7) in FIGS. 8 and 9. The process of step S504 is the same as the process described in step S304 of FIG. 3 (steps S401 to S404 of FIG. 4) described above. Specifically, the second battery 22 is CC-charged to a second voltage at which the actual SOC of the second battery 22 exceeds the upper limit voltage of the flat region, and the second battery 22 is CV-charged in a state in which the open circuit voltage of the second battery 22 is maintained at the second voltage. The second voltage in the normal SOC skip control may be the same as or different from the first voltage in the initial SOC skip control. Upon completing the CCCV charge, the process proceeds to step S505.

Step S505: After the CCCV charge is completed, the control device 51 performs control to make the charge/discharge amount of the second battery 22 equal to or less than a predetermined value. This is a period of (7) to (8) in FIGS. 8 and 9. The process of step S505 is the same as the process described in step S305 of FIG. 3 described above. Upon starting the control, the process proceeds to step S506.

Step S506: The control device 51 determines whether a state in which the charge/discharge amount of the second battery 22 is equal to or less than the predetermined value has continued during a first period of time. The process of step S506 is the same as the process described in step S306 of FIG. 3 described above. If it is determined that the state in which the charge/discharge amount of the second battery 22 is equal to or less than the predetermined value has continued during the first period of time (YES in S506), the process proceeds to step S509. If it is determined that the state in which the charge/discharge amount of the second battery 22 is equal to or less than the predetermined value has not continued during the first period of time (NO in S506), the process proceeds to step S507.

Step S507: The determination device 55 determines whether a second period of time has elapsed since the control device 51 has started the control to make the charge/discharge amount of the second battery 22 equal to or less than the predetermined value. The process of step S507 is the same as the process described in step S307 of FIG. 3 described above. If it is determined that the second period of time has elapsed since the control device 51 has started the control to make the charge/discharge amount of the second battery 22 equal to or less than the predetermined value (YES in S507), the process proceeds to step S508. If it is determined that the second period of time has not elapsed since the control device 51 has started the control to make the charge/discharge amount of the second battery 22 equal to or less than the predetermined value (NO in S507), the process proceeds to step S505.

Step S508: The control device 51 calculates the open circuit voltage of the second battery 22 by a known current-voltage plot method. The process of step S508 is the same as the process described in step S308 of FIG. 3 described above. Upon calculating the open circuit voltage, the process proceeds to step S509.

Step S509: The setting device 53 sets, as the control SOC, a fourth storage amount specified from the open circuit voltage of the second battery 22 obtained by performing the processing of steps S501 to S508. That is to say, the control SOC is instantaneously raised to the fourth storage amount specified from the open circuit voltage (SOC skip). The estimation device 52 matches the estimated SOC_MIN and SOC_MAX with the fourth storage amount simultaneously with the control SOC of the setting device 53 (that is to say, the integrated value of estimation errors is reset). This is timing (8) in FIGS. 8 and 9. By this setting process, the deviation between the actual SOC of the second battery 22 and the control SOC is corrected, and the normal SOC skip control ends.

Although the normal SOC skip control has been described with reference to FIGS. 8 and 9, even in FIG. 7, the normal SOC skip control described above is similarly implemented after timing (7) at which the initial SOC skip control ends.

An instruction to first perform either the CCCV charge control or the normal charge control when the READY-ON state is established after the IG-ON state described above, an instruction to give a timing at which the normal charge control is switched to the CCCV charge control, an instruction to give a timing at which the CCCV charge is finished and the open circuit voltage is acquired, or the like can be performed using predetermined flags.

Automatic Driving Permission Control

Automatic driving permission control will be described with reference to FIGS. 6, 7, 8 and 9. The automatic driving permission control is a control for determining whether to permit the first automatic driving system 13 and the second automatic driving system 23 to automatically drive the vehicle during a period in which a vehicle is in a drivable READY-ON state. The process shown in FIG. 6 is repeatedly executed in the period in which the READY-ON state is established.

Step S601: The determination device 55 monitors at least the SOC_MIN of the storage amount of the second battery 22 estimated by the estimation device 52. Upon starting the monitoring of the SOC_MIN, the process proceeds to step S602.

Step S602: The determination device 55 determines whether the SOC_MIN has exceeded a fifth storage amount equal to or more than the storage amount determined from a lower limit voltage of a flat region in a SOC-OCV characteristic curve. The fifth storage amount is set to a minimum storage amount (backup-enabling SOC) required for the second battery 22 to back up the functions related to the automatic driving of a vehicle when the first battery 12 fails during the automatic driving of the vehicle. In the examples of FIGS. 7, 8 and 9, the backup-enabling SOC is 60% of the storage amount. If it is determined that the SOC_MIN exceeds the fifth storage amount (YES in S602), the process proceeds to step S603. If it is determined that the SOC_MIN does not exceed the fifth storage amount (NO in S602), the process proceeds to step S604.

Step S603: The determination device 55 determines that the second battery 22 has the backup-enabling storage amount, thereby permitting the automatic driving of the vehicle. This is after timing (4) in FIGS. 7, 8 and 9. In the case of FIG. 8, the storage amount of the second battery 22 exceeds the backup-enabling SOC at the time of IG-ON. Therefore, control is executed so that the automatic driving of the vehicle can be permitted from the beginning.

Step S604: The determination device 55 determines that the second battery 22 does not have the backup-enabling storage amount, thereby not permitting the automatic driving of the vehicle. This is a period of (3) to (4) in FIGS. 7 and 9.

As described above, with the battery control unit 50 according to one embodiment of the disclosure, at the time of IG-ON of the vehicle, the open circuit voltage of the second battery 22 is acquired, and the control SOC is set to the storage amount (the third storage amount) that can be uniquely specified from the open circuit voltage based on the SOC-OCV characteristic curve. When the open circuit voltage of the second battery 22 falls within the specific range equal to or higher than the lower limit voltage of the flat region and equal to or lower than the upper limit voltage of the flat region in which the storage amount cannot be uniquely specified, the control SOC is set to the under-flat SOC (the first storage amount) determined from the lower limit voltage of the flat region. The CCCV charge is immediately performed to raise the control SOC during the READY-ON period. Then, after the open circuit voltage of the second battery 22 exceeds the upper limit voltage of the flat region (falls outside the flat region) by the CCCV charge so as to establish the state in which the storage amount can be uniquely specified from the open circuit voltage, the control SOC is set to the storage amount (the second storage amount) specified from the open circuit voltage.

By this control, the control SOC referred to as a value representing the storage amount of the battery is reset as soon as possible to the storage amount that can be uniquely specified from the open circuit voltage. Therefore, it is possible to suppress the deviation between the control SOC and the actual SOC of the second battery 22 and to accurately manage the state of charge of the second battery 22. Furthermore, in this control, the CCCV charge is performed based on the control SOC set lower than the actual SOC of the second battery 22. Therefore, it is possible to avoid a situation that the control SOC is excessively increased and the charge is finished before the open circuit voltage (actual SOC) of the second battery 22 gets out of the flat region. This makes it possible to reliably raise the open circuit voltage (actual SOC) of the second battery 22 to above the flat region.

Furthermore, with the battery control unit 50 according to the present embodiment, even when the difference between the minimum value (SOC_MIN) and the maximum value (SOC_MAX) obtained by estimating the storage amount of the second battery 22 including an integration error exceeds a predetermined threshold value during the READY-ON period, the CCCV charge is performed to increase the control SOC during the READY-ON period. Alternatively, even when a predetermined period of time has elapsed since the setting device 53 has performed the SOC skip control to set the control SOC to a new storage amount during the READY-ON period, the CCCV charge is performed to increase the control SOC. Then, after the open circuit voltage of the second battery 22 exceeds the upper limit voltage of the flat region by the CCCV charge so as to establish the state in which the storage amount can be uniquely specified from the open circuit voltage, the control SOC is set to the storage amount (the fourth storage amount) specified from the open circuit voltage.

By this control, the deviation between the control SOC and the actual SOC of the second battery 22 can be periodically suppressed during the READY-ON period. Therefore, it is possible to accurately and stably manage the state of charge of the second battery 22.

Furthermore, with the battery control unit 50 according to the present embodiment, the minimum value (SOC_MIN) obtained by estimating the storage amount of the second battery 22 including the integration error is monitored. The automatic driving of the vehicle is permitted if the SOC_MIN exceeds the backup-enabling SOC necessary for the second battery 22 to back up the functions related to the automatic driving of the vehicle when the failure of the first battery 12 occurs during the automatic driving of the vehicle.

By this control, even if the second battery 22 is in the flat region where the actual SOC cannot be specified and even if there is a possibility that the deviation between the control SOC and the actual SOC of the second battery 22 occur, the state in which the actual SOC of the second battery 22 becomes equal to or higher than the backup-enabling SOC can be reliably determined from the SOC_MIN. Therefore, even if the deviation between the control SOC and the actual SOC of the second battery 22 is not eliminated, it is possible to permit the automatic driving of the vehicle. Accordingly, automatic driving can be provided to a driver as soon as possible after IG-ON.

Although one embodiment has been described above, the disclosure may be regarded as a battery control unit, a vehicular power supply system including the battery control unit, an SOC skip control method executed by the battery control unit, an SOC skip control program, a non-transitory computer-readable recording medium storing the program, or a vehicle equipped with the battery control unit.

The battery control unit of the disclosure is applicable to a vehicle equipped with a redundant power supply system including two power supply systems.

What is claimed is:

1. A battery control unit for a vehicle for managing a state of charge of a battery which exhibits a SOC-OCV characteristic curve having a flat region in which a change rate of an open circuit voltage with respect to a storage amount of the battery is equal to or less than a predetermined value, the battery control unit comprising:
    an acquisition device configured to acquire the open circuit voltage of the battery;
    a determination device configured to perform a first determination to determine whether the open circuit voltage of the battery acquired by the acquisition device falls within a specific range, the specific range being a range from a lower limit voltage of the flat region to an upper limit voltage of the flat region;
    an estimation device configured to perform a first estimation to estimate the storage amount of the battery based on an integrated current amount;
    a setting device configured to set a control storage amount which is referred to as a value representing the storage amount of the battery; and
    a control device configured to control a charge and discharge of the battery based on the open circuit voltage of the battery or the control storage amount such that the storage amount of the battery becomes a predetermined target value,
    wherein when the determination device determines that the open circuit voltage of the battery falls within the specific range when the vehicle is in an ignition-on state, the setting device sets the control storage amount to a first storage amount less than a storage amount that is determined from the lower limit voltage of the flat region based on the characteristic curve,
    the control device charges the battery based on the open circuit voltage until the open circuit voltage of the battery becomes a first voltage, that exceeds the upper limit voltage of the flat region, after the control storage amount is set to the first storage amount and the vehicle comes into a drivable state, and
    the setting device sets the storage amount estimated by the estimation device to the control storage amount until the open circuit voltage of the battery reaches the first voltage, and sets a second storage amount, that is determined from the open circuit voltage of the battery based on the characteristic curve, to the control storage amount after the open circuit voltage of the battery reaches the first voltage.

2. The battery control unit according to claim 1, wherein when the determination device determines that the open circuit voltage of the battery does not fall within the specific range when the vehicle is in the ignition-on state, the setting device sets a third storage amount, that is determined from the open circuit voltage of the battery based on the characteristic curve, to the control storage amount.

3. The battery control unit according to claim 1, wherein:
    the estimation device is configured to further perform a second estimation to estimate a maximum value and a minimum value of the storage amount of the battery including an integrated value of estimation errors of a charge amount of the battery and an integrated value of estimation errors of a discharge amount of the battery;
    the determination device is configured to further perform a second determination to determine whether a difference between the minimum value and the maximum value of the storage amount of the battery estimated in the second estimation by the estimation device exceeds a predetermined threshold value;
    when the determination device determines that the difference exceeds the predetermined threshold value in the second determination, the control device charges the battery based on the open circuit voltage until the open circuit voltage of the battery reaches a second voltage, that exceeds the upper limit voltage of the flat region;
    the setting device sets the storage amount estimated by the estimation device in the first estimation to the control storage amount until the open circuit voltage of the battery reaches the second voltage, and sets a fourth storage amount, that is determined from the open circuit voltage of the battery based on the characteristic curve, to the control storage amount after the open circuit voltage of the battery reaches the second voltage; and
    the estimation device matches the minimum value and the maximum value of the storage amount of the battery with the fourth storage amount.

4. The battery control unit according to claim 1, wherein:
    the determination device is configured to further perform a third determination to determine whether a predetermined period of time has elapsed since the setting device set the control storage amount to the second storage amount or the third storage amount; and
    when the determination device determines that the predetermined period of time has elapsed in the third determination, the control device charges the battery based on the open circuit voltage until the open circuit voltage of the battery becomes a second voltage, that exceeds the upper limit voltage of the flat region; and
    the setting device sets the storage amount estimated by the estimation device in the first estimation to the control storage amount until the open circuit voltage of the battery reaches the second voltage, and sets a fourth storage amount, that is determined from the open circuit voltage of the battery based on the characteristic curve, to the control storage amount after the open circuit voltage of the battery reaches the second voltage.

5. The battery control unit according to claim 3, wherein the determination device is configured to further perform a fourth determination to permit an automatic driving of the vehicle when the determination device determines that when the vehicle is in the drivable state, the minimum value of the storage amount of the battery estimated by the estimation device in the second estimation has exceeded a fifth storage amount, that is equal to or larger than the storage amount determined from the lower limit voltage of the flat region.

* * * * *